United States Patent
Fukuhara et al.

(10) Patent No.: US 7,692,769 B2
(45) Date of Patent: Apr. 6, 2010

(54) EXPOSURE APPARATUS, EXPOSURE METHOD, AND SEMICONDUCTOR DEVICE MANUFACTURING METHOD

(75) Inventors: Kazuya Fukuhara, Tokyo (JP); Takashi Sato, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 581 days.

(21) Appl. No.: 11/543,082

(22) Filed: Oct. 5, 2006

(65) Prior Publication Data

US 2007/0081139 A1    Apr. 12, 2007

(30) Foreign Application Priority Data

Oct. 7, 2005    (JP)   ............... 2005-294689

(51) Int. Cl.
     *G03B 27/54*    (2006.01)
     *G03B 27/72*    (2006.01)

(52) U.S. Cl. .......................... 355/71; 355/67

(58) Field of Classification Search ............. 355/67–71, 355/52, 53, 55; 378/34, 35; 250/548; 356/399–401
See application file for complete search history.

(56) References Cited

U.S. PATENT DOCUMENTS

| | | | |
|---|---|---|---|
| 5,559,583 A | 9/1996 | Tanabe | |
| 5,815,247 A | 9/1998 | Poschenrieder et al. | |
| 6,930,758 B2 * | 8/2005 | Schuster et al. | 355/67 |
| 7,423,731 B2 * | 9/2008 | Tanitsu et al. | 355/71 |
| 2005/0153540 A1 | 7/2005 | Mimotogi et al. | |
| 2006/0132748 A1 | 6/2006 | Fukuhara | |

FOREIGN PATENT DOCUMENTS

| | | |
|---|---|---|
| JP | 6-53120 | 2/1994 |
| JP | 2003-203850 | 7/2003 |

* cited by examiner

*Primary Examiner*—Hung Henry Nguyen
(74) *Attorney, Agent, or Firm*—Finnegan, Henderson, Farabow, Garrett & Dunner, L.L.P.

(57) ABSTRACT

According to an aspect of the invention, there is provided an exposure apparatus including an illumination optical system which forms an effective light source having a first polarization area where a mask pattern is illuminated with polarized light dominated by an electric vector component radial from a center position on an effective light source plane, and a second polarization area where the mask pattern is illuminated with light whose electric vector vibration is not biased in a specific direction; and a projection optical system which projects an image of the mask pattern onto an object to be processed.

20 Claims, 14 Drawing Sheets

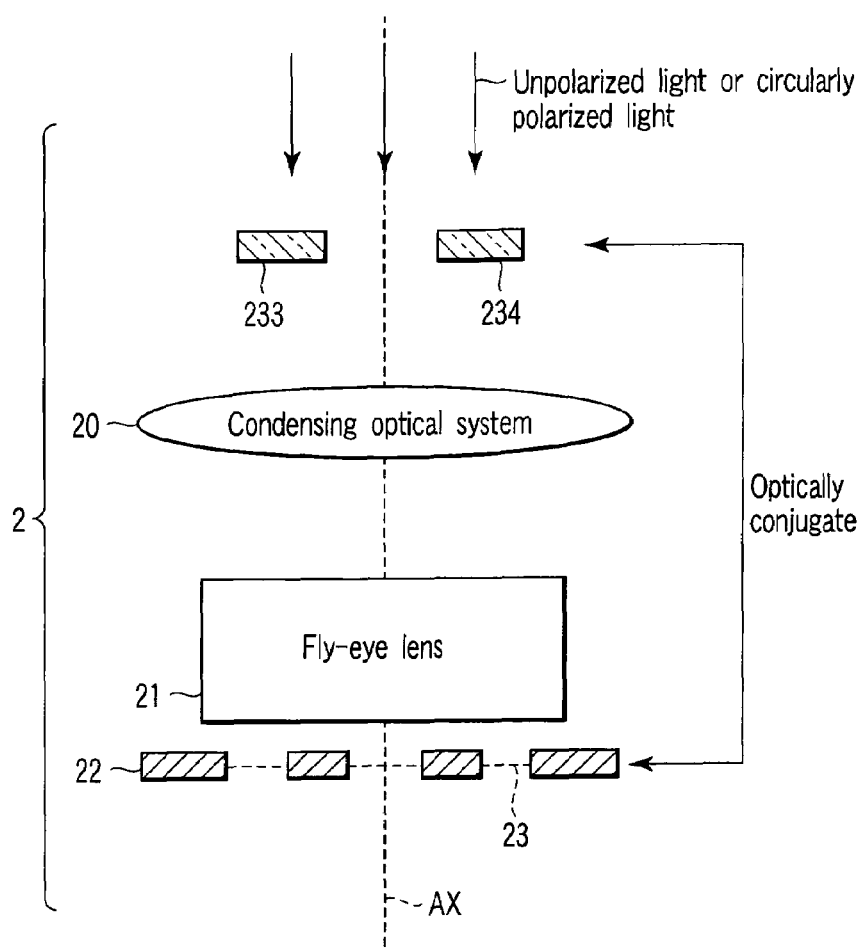
F I G. 17
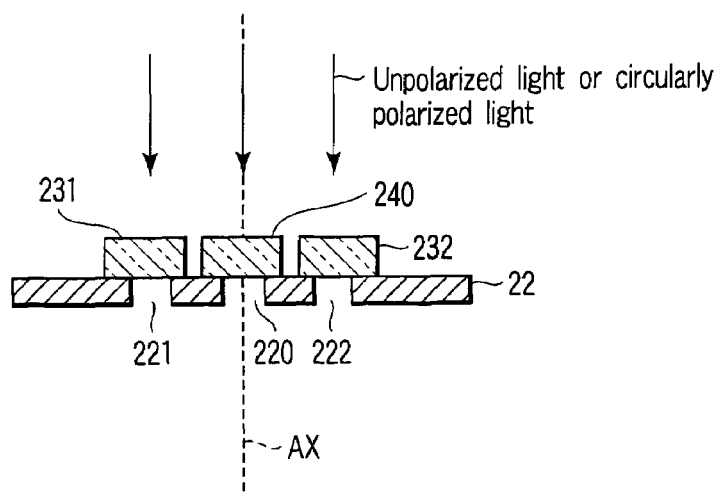
F I G. 18

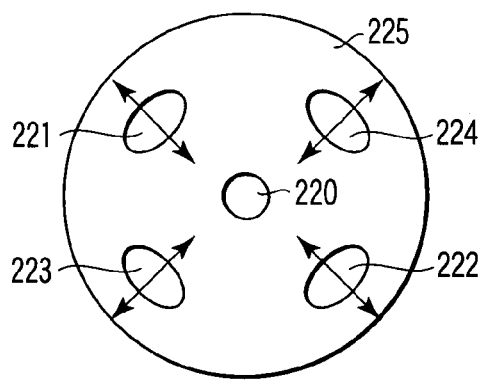
F I G. 27
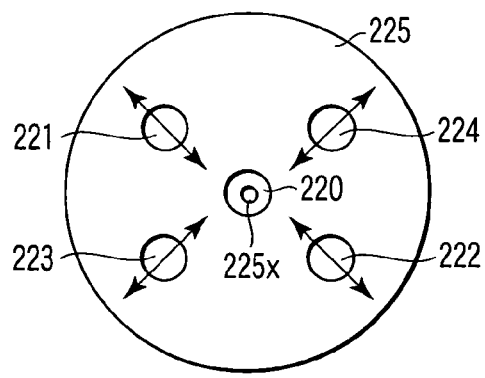
F I G. 28
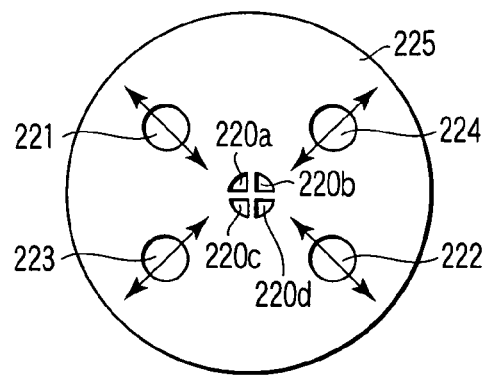
F I G. 29

EXPOSURE APPARATUS, EXPOSURE METHOD, AND SEMICONDUCTOR DEVICE MANUFACTURING METHOD

CROSS-REFERENCE TO RELATED APPLICATIONS

This application is based upon and claims the benefit of priority from prior Japanese Patent Application No. 2005-294689, filed Oct. 7, 2005, the entire contents of which are incorporated herein by reference.

BACKGROUND OF THE INVENTION

1. Field of the Invention

The present invention relates to photolithography and, more particularly, to an exposure apparatus and an exposure method used to form a fine pattern in manufacturing a semiconductor device or the like, and to a semiconductor device manufacturing method.

2. Description of the Related Art

The manufacture of a semiconductor device using photolithography uses a projection exposure apparatus. The projection exposure apparatus irradiates, with illumination light, a mask pattern drawn on a photomask (reticle) and formed from a transmitting portion and light-shielding portion. The projection exposure apparatus projects light having passed through the photomask onto an object to be processed such as a silicon (Si) wafer via a projection optical system, forming a resist pattern.

The minimum transferable cycle (resolution) of the projection exposure apparatus is proportional to the wavelength of exposure light and inversely proportional to the numerical aperture (NA) of the projection optical system. At present, an argon fluoride (ArF) excimer laser beam having a wavelength of 193 nm is generally used. However, constraints on glass for use and the like make it difficult to further reduce the wavelength of exposure light. In recent years, the resolution is decreasing for a higher NA of the projection optical system, and a projection exposure apparatus whose NA exceeds 0.9 is becoming available.

A higher NA of the projection lens changes the imaging characteristic owing to a difference in light polarization state. Imaging of a fine pattern through a high-NA lens increases the incident angle of light on the surface of an object to be processed. As the incident angle becomes larger, the difference in light polarization direction more influences interference of light. There has conventionally been examined a method of polarizing light to be projected on an object to be processed by controlling the polarization state of illumination light (see, e.g., Jpn. Pat. Appln. KOKAI Publication No. 6-53120). However, it is difficult to increase the lithography margin when forming a fine pattern such as a hole pattern, failing to form a fine resist pattern into a desired shape.

BRIEF SUMMARY OF THE INVENTION

According to an aspect of the invention, there is provided an exposure apparatus comprising: an illumination optical system which forms an effective light source having a first polarization area where a mask pattern is illuminated with polarized light dominated by an electric vector component radial from a center position on an effective light source plane, and a second polarization area where the mask pattern is illuminated with light whose electric vector vibration is not biased in a specific direction; and a projection optical system which projects an image of the mask pattern onto an object to be processed.

According to another aspect of the invention, there is provided an exposure method comprising: performing first illumination for a mask pattern with polarized light dominated by an electric vector component radial from a center position on an effective light source plane; performing second illumination for the mask pattern with light whose electric vector vibration is not biased in a specific direction on the effective light source plane; and projecting an image of the mask pattern obtained as a result of the first illumination and the second illumination onto an object to be processed via a projection optical system.

According to another aspect of the invention, there is provided a semiconductor device manufacturing method comprising: performing first illumination for a mask pattern with polarized light dominated by an electric vector component radial from a center position on an effective light source plane; performing second illumination for the mask pattern with light whose electric vector vibration is not biased in a specific direction on the effective light source plane; and projecting an image of the mask pattern obtained as a result of the first illumination and the second illumination onto an object to be processed via a projection optical system, thereby manufacturing a semiconductor device using the object.

BRIEF DESCRIPTION OF THE SEVERAL VIEWS OF THE DRAWING

FIG. 17 is a view shown by turning the arrangement shown in FIG. 16 by 90° about AX.

FIG. 18 is a schematic view showing an example of arranging a polarizer and neutral-density filter on the effective light source plane when the light source emits unpolarized light or circularly polarized light according to the embodiment of the present invention;

FIG. 27 is a plan view showing an example of pentapole/radially polarized illumination according to another embodiment of the present invention;

FIG. 28 is a plan view showing another example of pentapole/radially polarized illumination according to still another embodiment of the present invention; and FIG. 29 is a plan view showing still another example of pentapole/radially polarized illumination according to still another embodiment of the present invention.

DETAILED DESCRIPTION OF THE INVENTION

Figure 1:
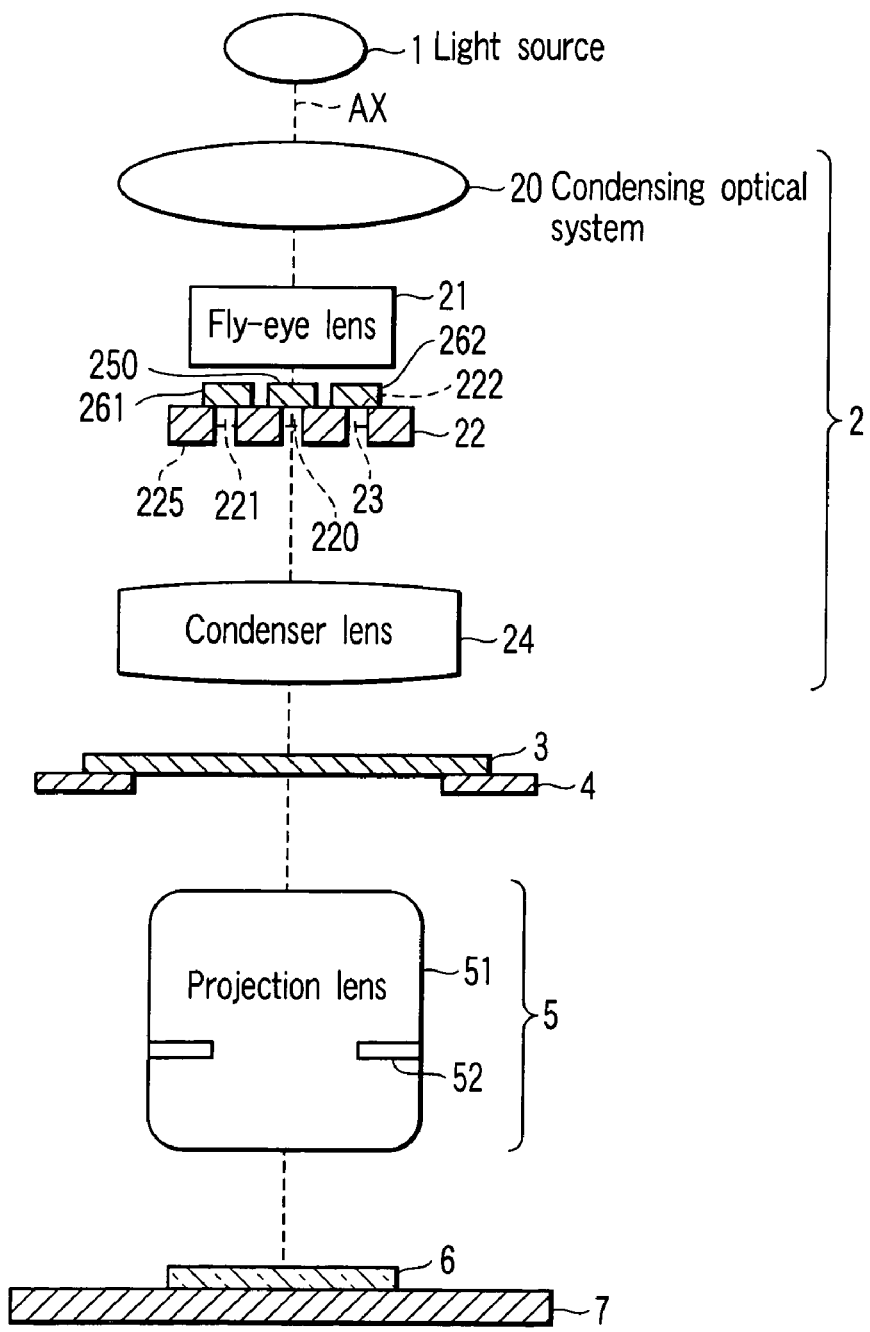
FIG. 1 is a schematic sectional view showing an example of an exposure apparatus according to an embodiment of the present invention.

Embodiments of the present invention will be described below with reference to the views of the accompanying drawing. In the description of the drawing, the same or similar reference numerals denote the same or similar parts. However, the views are schematic, and it should be noted that the relationship between the thickness and the planar dimension, the ratio of the thicknesses of respective layers, and the like are different from practical ones. Practical thicknesses and dimensions should be determined in consideration of the following description. In addition, portions may differ in dimensional relationship and ratio between views. The following embodiments illustrate an apparatus and method for implementing the technical concept of the invention, and the technical concept of the invention does not limit the materials, shapes, structures, arrangements, and the like of building components to the following ones. The technical concept of the invention allows various modifications within the scope of the appended claims.

As shown in FIG. 1, an exposure apparatus according to an embodiment of the present invention comprises an illumination optical system 2 which forms an effective light source, and a projection optical system 5 which projects the image of a mask pattern onto an object (wafer) 6 to be processed. The effective light source has first polarization areas 221 and 222 where a mask pattern is illuminated with polarized light dominated by an electric vector component radial from the center position on the effective light source plane, and a second polarization area 220 where the mask pattern is illuminated with light whose electric vector vibrations are not biased in a specific direction.

The exposure apparatus is a projection/reduction exposure apparatus (stepper) having a reduction ratio of, e.g., ¼. Note that the reduction ratio is not particularly limited to ¼ and is arbitrary. As the exposure apparatus, a scanner is available in addition to the stepper. The present invention is also applicable not only to a dioptric exposure apparatus but also to a reflection or catadioptric exposure apparatus.

The exposure apparatus comprises a light source 1, the illumination optical system 2, a mask stage 4, the projection optical system 5, and a wafer stage 7. The light source 1 is, e.g., an ArF excimer laser source having the wavelength $\lambda=193$ nm. In addition to the ArF excimer laser source, the light source 1 may be a fluorine ($F_2$) excimer laser source having the wavelength $\lambda=157$ nm, a krypton fluoride (KrF) excimer laser source having the wavelength $\lambda=248$ nm, or the like. Further, the light source 1 is not limited to the excimer laser source, and a light source 1 which emits ultraviolet rays (i-line) having the wavelength $\lambda=365$ nm or extreme ultraviolet (EUV) rays having the wavelength $\lambda=10$ to 20 nm is also available.

The illumination optical system 2 includes a condensing optical system 20, fly-eye lens 21, illumination stop 22, and condenser lens 24. The condensing optical system 20 condenses illumination light from the light source 1. The fly-eye lens 21 uniforms the light intensity distribution of illumination light from the condensing optical system 20.

The illumination stop 22 selectively shields light to define illumination. The illumination stop 22 is arranged on an effective light source plane (secondary light source plane) 23. The effective light source plane 23 substantially coincides with a plane having almost the Fourier transform relationship with the mask pattern plane of a photomask 3, i.e., with the Fourier transform plane of the mask pattern surface. The projection optical system 5 comprises a projection lens 51 and aperture stop 52. The plane surrounded by the aperture stop 52 is a pupil. The optical axis AX is the center line of the light source 1, illumination optical system 2, and projection optical system 5.

Figure 2:
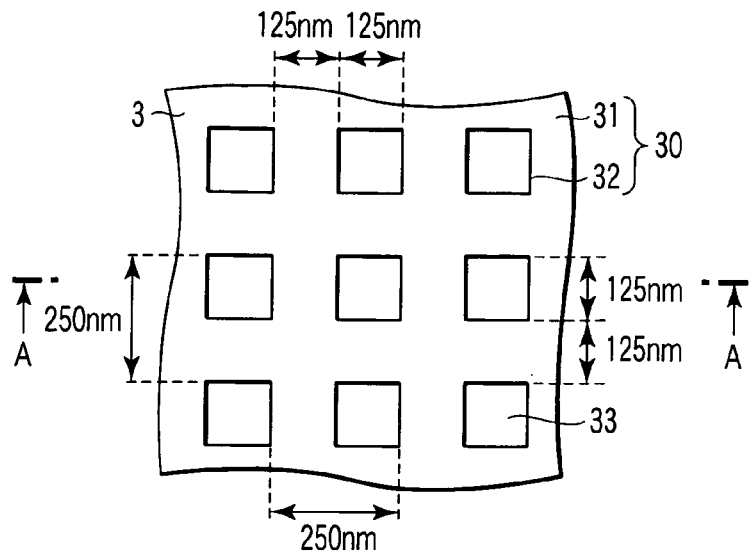
FIG. 2 is a plan view showing an example of a photomask according to the embodiment of the present invention.
Figure 3:
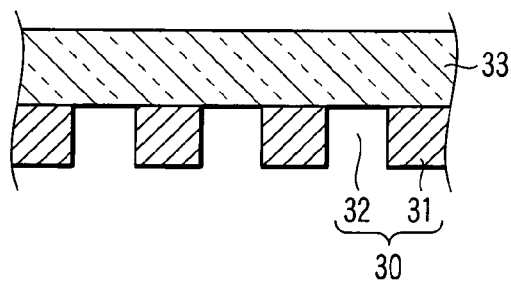
FIG. 3 is a sectional view (sectional view taken along the line A-A in FIG. 2) showing the example of the photomask according to the embodiment of the present invention.

The photomask 3 is, e.g., a halftone phase shift mask having a mask pattern 30 as shown in FIGS. 2 and 3. The mask pattern 30 has a light-shielding portion 31 formed on a transparent substrate 33 and a plurality of apertures 32 formed in a matrix at the light-shielding portion 31. The apertures 32 is a pattern for forming a resist pattern of a hole pattern shape on the object 6 to be processed. For example, one side of the aperture 32 is 125 nm long, and the space width between adjacent apertures 32 is 125 nm.

Illuminating the mask pattern 30 generates 0th to higher-order diffracted light components. As the cycle of the aperture 32 of the mask pattern 30 decreases, the angle of diffracted light increases and only low-order diffracted light components contribute to imaging. Hence, an optical image whose cycle on the object 6 is equal to or shorter than the light wavelength is formed mainly by interference of 0th-order diffracted light, 1st-order diffracted light (either the ($\pm$1,0)th or (0,$\pm$1)th order), or 2nd-order diffracted light (($\pm$1,$\pm$1)th order).

Figure 4:
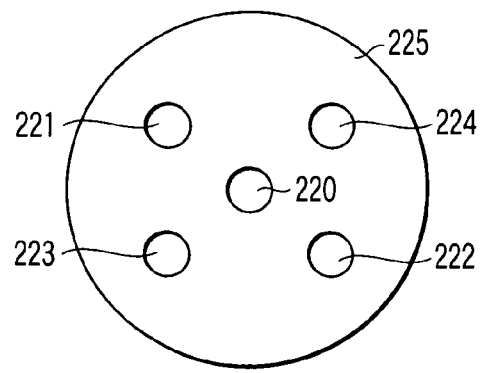
FIG. 4 is a plan view showing an example of pentapole/unpolarized illumination representing the light intensity distribution and polarization state on the effective light source plane of the illumination system of the exposure apparatus according to the embodiment of the present invention.

The illumination stop 22 selectively shields light, and defines pentapole illumination as illumination as shown in FIG. 4. The pentapole illumination shown in FIG. 4 is unpolarized illumination in which the electric vector vibrations of light are not biased. The pentapole illumination serving as unpolarized illumination has the center area (first polarization area) 220 positioned at the center of the effective light source plane 23, first to fourth eccentric areas (second polarization areas) 221 to 224 arranged rotationally symmetrical through 90° about the optical axis AX, and a peripheral area 225. The first and second eccentric areas 221 and 222 exist at positions of the same distance from the optical axis AX on a straight line passing through the optical axis AX. The third and fourth eccentric areas 223 and 224 exist at positions of the same distance from the optical axis AX on a straight line perpendicular to the straight line which couples the first and second eccentric areas 221 and 222. The peripheral area 225 is arranged around the center area 220 and the first to fourth eccentric areas 221 to 224.

The center area 220 and the first to fourth eccentric areas 221 to 224 correspond to apertures of the illumination stop 22. The center area 220 has a maximum light intensity and forms light (vertical light) which vertically illuminates the mask pattern 30. The first and second eccentric areas 221 and 222 have a maximum light intensity and form light components (first obliquely incident light components) which obliquely illuminate the mask pattern 30 from opposite positions. The third and fourth eccentric areas 223 and 224 have a maximum light intensity and form light components (second obliquely incident light components) which illuminate the mask pattern 30 from opposite positions different from the positions of the first and second eccentric areas 221 and 222. The peripheral area 225 is a light-shielding area which is lower in light intensity than the center area 220 and the first to fourth eccentric areas 221 to 224 or does not transmit any light. The periphery of the peripheral area 225 is given by the illumination coherence factor $\sigma$ of 1.

Figure 5:
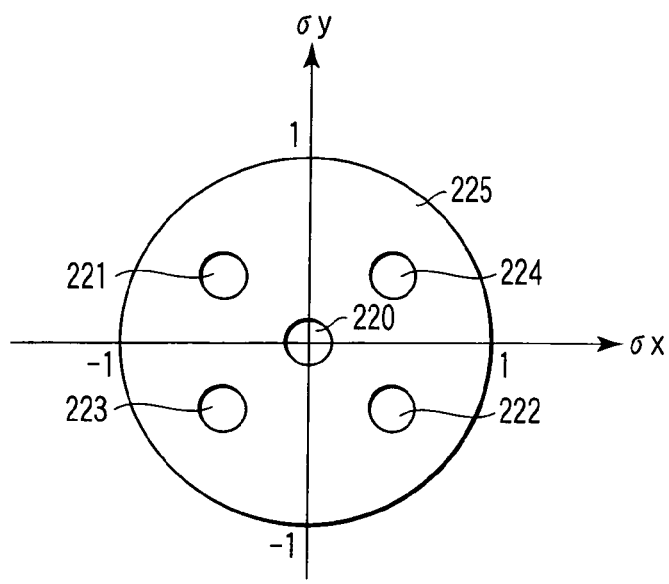
FIG. 5 is a schematic view showing an illumination coordinate system according to the embodiment of the present invention.

The coordinate system of the pentapole illumination for unpolarized illumination shown in FIG. 4 is given by the $\sigma$ coordinate system (=the numerical aperture of the illumination optical system/the numerical aperture of the projection lens), as shown in FIG. 5. FIG. 5 shows the coordinates of light-transmitting areas. The center of the center area 220 is positioned on the optical axis AX (0,0), and its radius is 0.1. The centers of the first to fourth eccentric areas 221 to 224 are positioned at (−0.4,0.4), (0.4,−0.4), (−0.4,−0.4), and (0.4,0.4), respectively, and their radii are 0.1.

Figure 6:
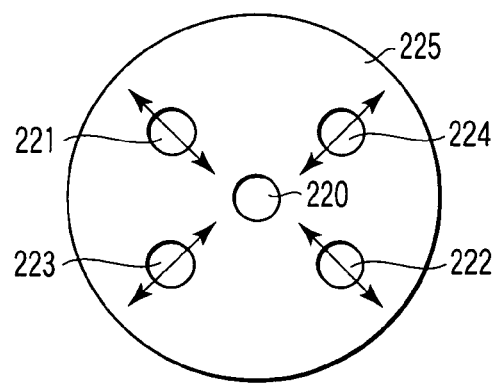
FIG. 6 is a plan view showing an example of pentapole/radially polarized illumination representing the light intensity distribution and polarization state on the effective light source plane of the illumination system of the exposure apparatus according to the embodiment of the present invention.

Pentapole illumination shown in FIG. 6 is radially polarized illumination. The center area 220 corresponds light whose electric vector vibrations are not biased in a specific direction. Light whose electric vector vibrations are not biased in a specific direction may be unpolarized light (light free from any polarization) or circularly polarized light.

In the first to fourth eccentric areas 221 to 224, electric vectors vibrate mainly in the radial direction of the effective light source plane 23, as represented by arrows. First obliquely incident light components respectively formed by the first and second eccentric areas 221 and 222 have electric vector components larger in a direction parallel to a straight line coupling the first and second eccentric areas 221 and 222 than in the perpendicular direction. Second obliquely incident light components respectively formed by the third and fourth eccentric areas 223 and 224 have electric vector components larger in a direction parallel to a straight line coupling the third and fourth eccentric areas 223 and 224 than in the perpendicular direction. That is, the first and second obliquely incident light components form polarized light dominated by an electric vector component in the radial direction. The "radial direction" means a direction outward from the center position which is the position of the optical axis AX on the effective light source plane 23. The polarized light illuminates the mask pattern 30.

Figure 7:
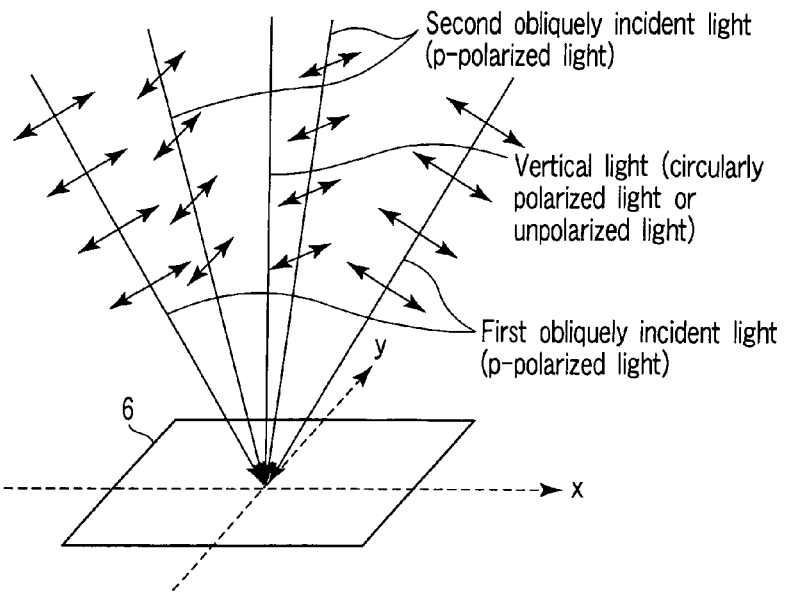
FIG. 7 is a schematic perspective view for explaining p-polarization according to the embodiment of the present invention.

The electric vector vibration directions of the first and second obliquely incident light components in the radially polarized illumination shown in FIG. 6 are parallel to the incident plane, as shown in FIG. 7. The polarization state of light when the electric vector vibration direction falls within the incident plane (plane defined by the light traveling direction and the optical axis of the optical system) is called p-polarization (or TM polarization). In p-polarization, the electric vector vibration directions of the first and second obliquely incident light components incident on the object 6 are not parallel to each other, so no interference occurs between the first and second obliquely incident light components in comparison with a case where they are parallel to each other.

Figure 8:
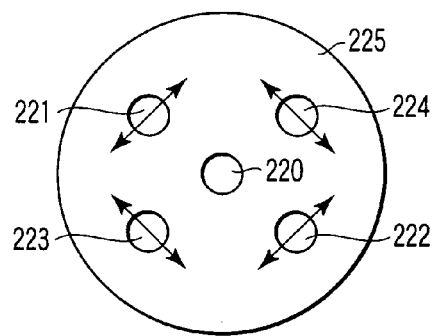
FIG. 8 is a plan view showing an example of pentapole/tangentially polarized illumination representing the light intensity distribution and polarization state on the effective light source plane of the illumination system of the exposure apparatus according to the embodiment of the present invention.

Pentapole illumination shown in FIG. 8 is tangentially polarized illumination. The center area 220 does not polarize light. In the first to fourth eccentric areas 221 to 224, electric vectors vibrate in a direction perpendicular to the radial direction of the effective light source plane 23, i.e., in a direction tangential to the circle of the effective light source plane 23. First obliquely incident light components respectively formed by the first and second eccentric areas 221 and 222 have electric vector components larger in a direction perpendicular to a straight line coupling the first and second eccentric areas 221 and 222 than in the parallel direction. Second obliquely incident light components respectively formed by the third and fourth eccentric areas 223 and 224 have electric vector components larger in a direction perpendicular to a straight line coupling the third and fourth eccentric areas 223 and 224 than in the parallel direction.

Figure 9:
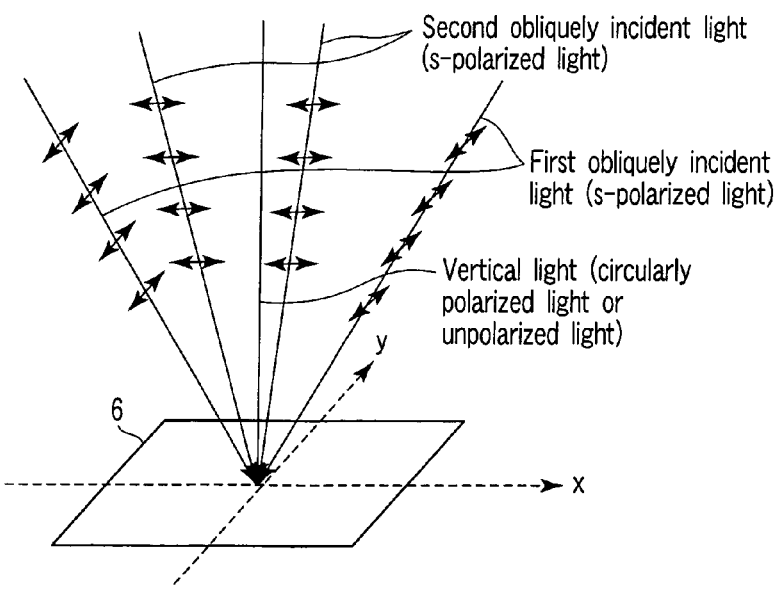
FIG. 9 is a schematic perspective view for explaining s-polarization according to the embodiment of the present invention.

The electric vector vibration directions of the first and second obliquely incident light components in the tangentially polarized illumination shown in FIG. 8 are perpendicular to the incident plane, as shown in FIG. 9. The polarization state of light when the electric vector vibration direction is perpendicular to the incident plane is called s-polarization (or TE polarization). In interference by s-polarization, the electric vector vibration directions of the first and second obliquely incident light components are parallel to each other, and the degree of interference between the first and second obliquely incident light components is higher than a case where they are not parallel to each other.

Figure 10:
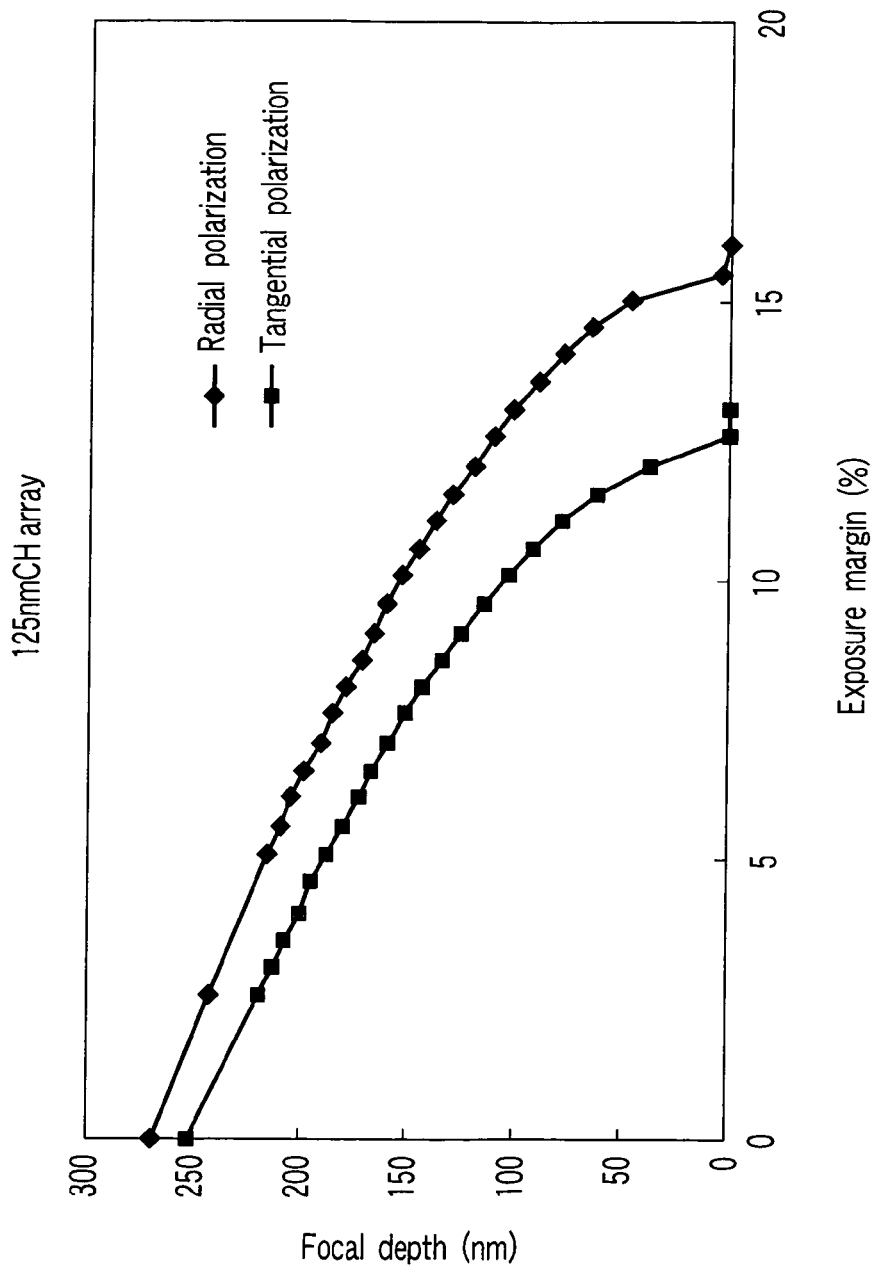
FIG. 10 is a graph showing the relationship between the exposure amount margin and the focal depth according to the embodiment of the present invention.

The lithography margin (exposure amount margin) were obtained by simulation when forming a hole pattern at the NA of the projection lens 51=0.92 and the lengthwise and breadthwise pitches shown in FIGS. 2 and 3=250 nm using the unpolarized illumination shown in FIG. 4, the radially polarized illumination shown in FIG. 6, and the tangentially polarized illumination shown in FIG. 8. FIG. 10 shows the lithography margin (exposure amount margin) obtained by simulation. The abscissa represents the lithography margin (exposure amount margin), and the ordinate represents the focal depth. FIG. 10 shows a range where the resist dimension takes a desired value (125±12.5 nm). FIG. 10 omits the profile of the lithography margin (exposure amount margin) for the unpolarized illumination shown in FIG. 4. In the profile of the unpolarized illumination, a curve exists between the profiles of the radially polarized illumination and tangentially polarized illumination. The lithography margin is apparently obtained from the simulation result. Hence, a fine resist pattern can be formed with a desired shape.

Figure 11:
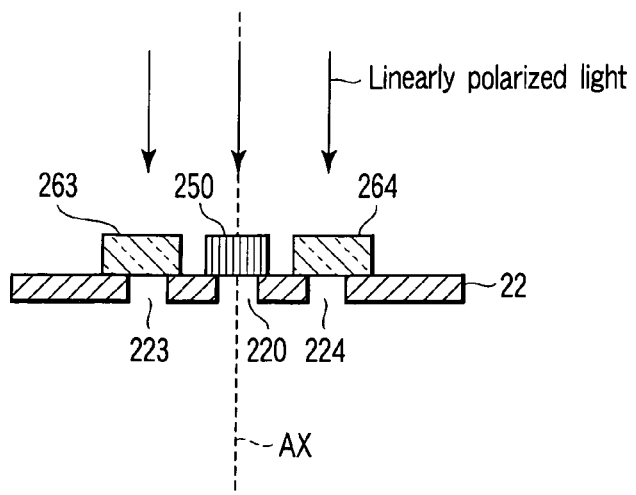
FIG. 11 is a schematic view showing an example of arranging a ½ wave plate (half-wave plate) and ¼ wave plate (quarter-wave plate) at optically conjugate positions when the light source emits linearly polarized light according to the embodiment of the present invention.

A case of forming radially polarized illumination as shown in FIG. 6 as pentapole illumination will be explained. When light emitted from the light source 1 shown in FIG. 1 is, e.g., linearly polarized light, radially polarized illumination is implemented by arranging a wave plate on the effective light source plane 23 or a plane optically conjugate to the effective light source plane 23. For example, first obliquely incident light components are generated from linearly polarized light by arranging ½ wave plates 261 and 262 on the illumination stop 22 in optical paths passing through the first and second eccentric areas 221 and 222, as shown in FIG. 1. Second obliquely incident light components are generated from linearly polarized light by inserting ½ wave plates 263 and 264 in optical paths passing through the third and fourth eccentric areas 223 and 224, as shown in FIG. 11. Circularly polarized light is generated from linearly polarized light by inserting a ¼ wave plate 250 in an optical path passing through the center area 220. Note that the ½ wave plates 261 and 262, the ½ wave plates 263 and 264, and the ¼ wave plate 250 need not contact the illumination stop 22, and may be spaced apart from the illumination stop 22 near the effective light source plane 23.

Figure 12:
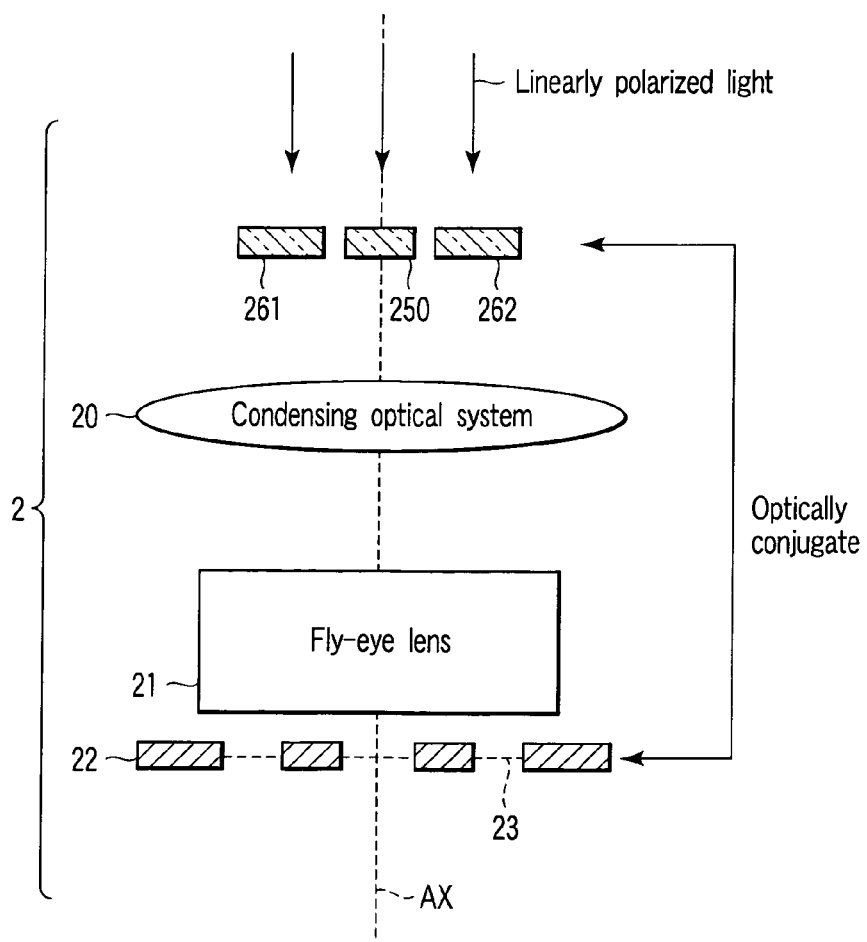
FIG. 12 is a schematic view showing an example of arranging a ½ wave plate (half-wave plate) and ¼ wave plate (quarter-wave plate) at optically conjugate positions when the light source emits linearly polarized light according to the embodiment of the present invention.
Figure 13:
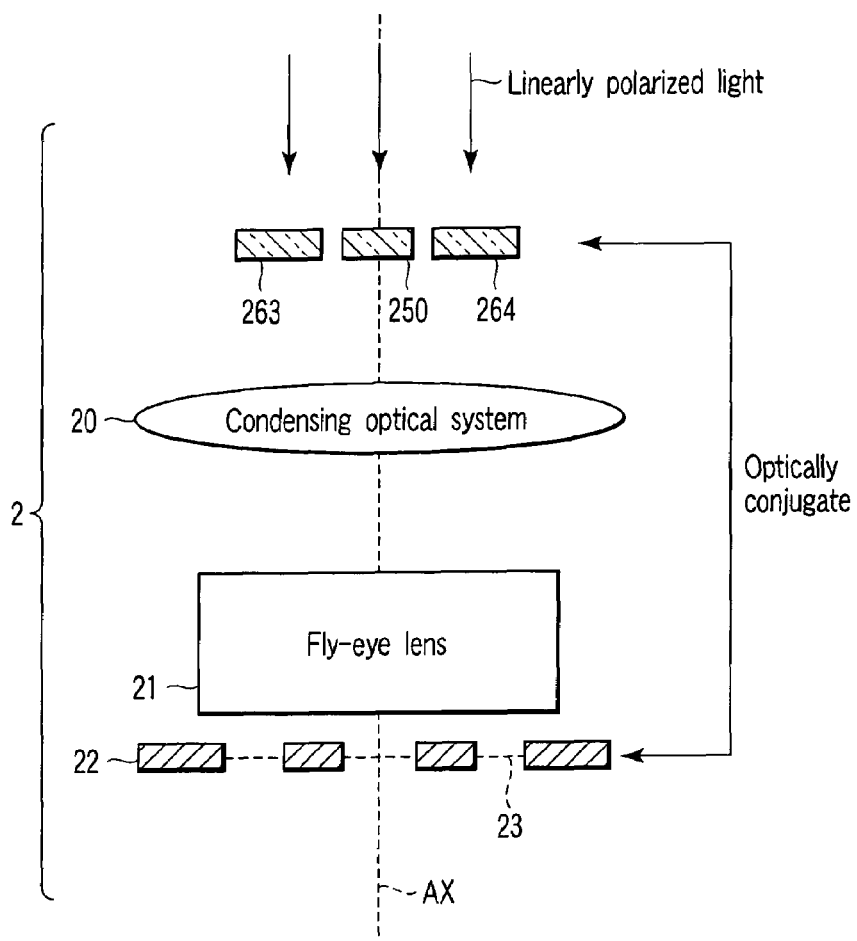
FIG. 13 is a view shown by turning the arrangement shown in FIG. 12 by 90° about AX.

When light emitted from the light source 1 is linearly polarized light, the ¼ wave plate 250 may be inserted in an optical path passing through the center area 220 on a plane optically conjugate to the effective light source plane 23, as shown in FIG. 12. Further, the ½ wave plates 261 and 262 may be inserted in optical paths passing through the first and second eccentric areas 221 and 222, and the ½ wave plates 263 and 264 may be inserted in optical paths passing through the third and fourth eccentric areas 223 and 224, as shown in FIG. 13. Note that FIG. 13 is the view shown by turning the arrangement shown in FIG. 12 by 90° about AX.

Figure 14:
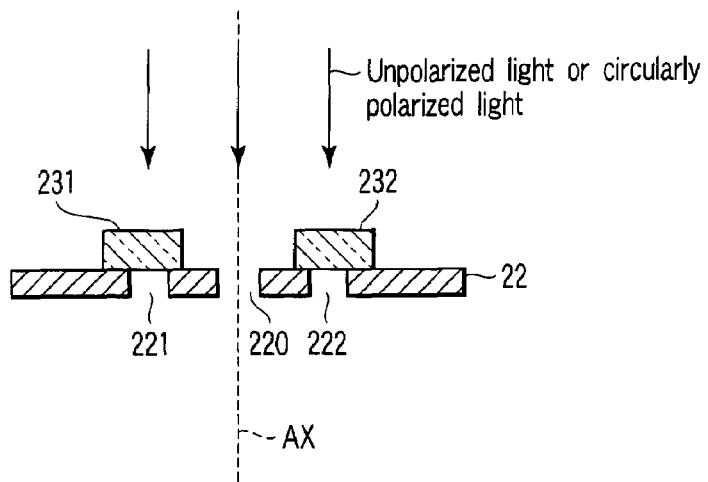
FIG. 14 is a schematic view showing an example of arranging a polarizer on the effective light source plane when the light source emits unpolarized light or circularly polarized light according to the embodiment of the present invention.
Figure 15:
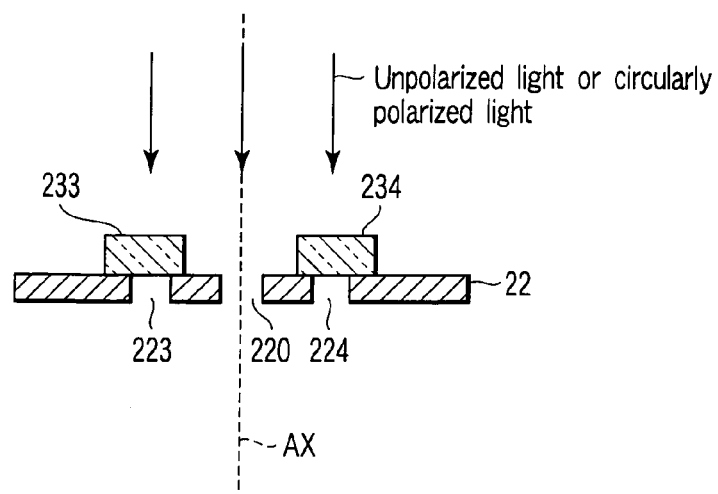
FIG. 15 is a schematic view showing an example of arranging a polarizer on the effective light source plane when the light source emits unpolarized light or circularly polarized light according to the embodiment of the present invention.

When light emitted from the light source 1 is unpolarized light (light free from polarization) or circularly polarized light, polarizers 231 and 232 are arranged on the illumination stop 22 in optical paths passing through the first and second eccentric areas 221 and 222, as shown in FIG. 14. The polarizers 231 and 232 transmit only predetermined linearly polarized light components among incident light components. For example, the polarizers 231 and 232 are arranged in a direction in which they transmits, among first obliquely incident light components passing through the first and second eccentric areas 221 and 222, only light whose electric vector vibration direction is parallel to a straight line coupling the first and second eccentric areas 221 and 222 as represented by arrows. Thus, first obliquely incident light components having passed through the first and second eccentric areas 221 and 222 are polarized linearly in a direction parallel to the straight light coupling the first and second eccentric areas 221 and 222. Similarly, polarizers 233 and 234 are inserted in optical paths passing through the third and fourth eccentric areas 223 and 224, as shown in FIG. 15. This arrangement generates second obliquely incident light components linearly polarized in a direction parallel to a straight line coupling the third and fourth eccentric areas 223 and 224. To the contrary, vertical light passing through the center area 220 is not polarized or is circularly polarized. Note that the polarizers 231 and 232 and the polarizers 233 and 234 need not contact the illumination stop 22, and may be spaced apart from the illumination stop 22 near the effective light source plane 23.

Figure 16:
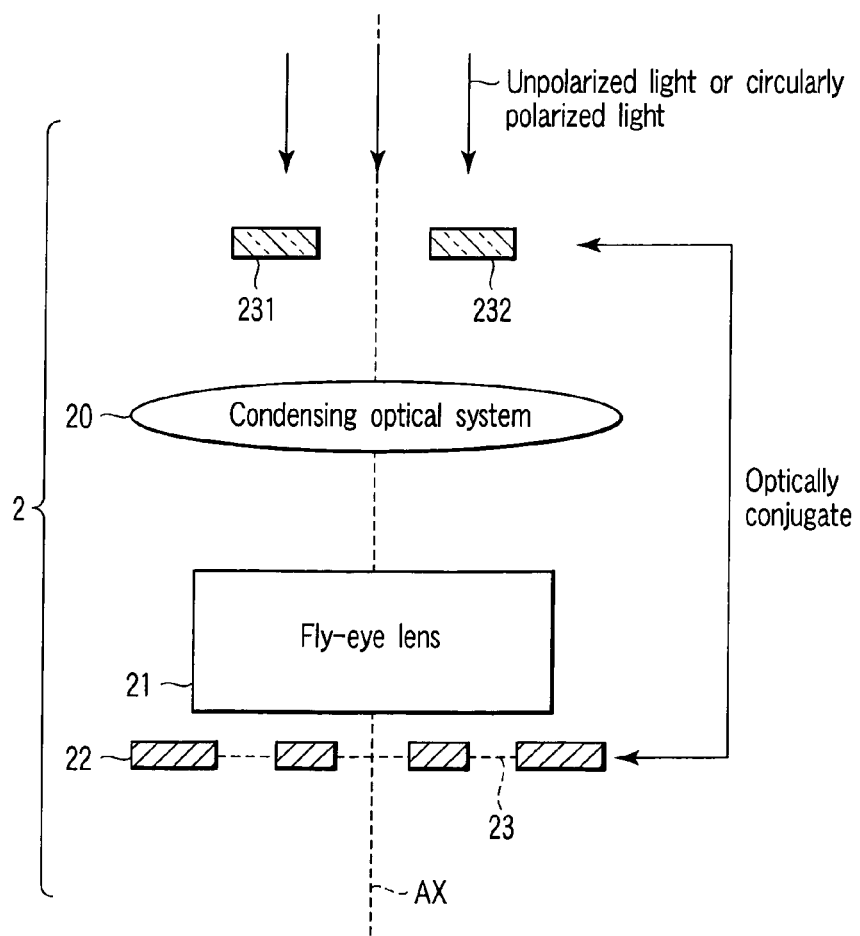
FIG. 16 is a schematic view showing an example of arranging a polarizer at an optically conjugate position when the light source emits unpolarized light or circularly polarized light according to the embodiment of the present invention.

When light emitted from the light source 1 is unpolarized light or circularly polarized light, as shown in FIG. 16, the polarizers 231 and 232 may be arranged on a plane optically conjugate to the effective light source plane 23 in optical paths passing through the first and second eccentric areas 221 and 222, and the polarizers 233 and 234 may be arranged in optical paths passing through the third and fourth eccentric areas 223 and 224, as shown in FIG. 17. Note that FIG. 17 is the view shown by turning the arrangement shown in FIG. 16 by 90° about AX.

When light emitted from the light source 1 is unpolarized light or circularly polarized light, a neutral-density filter 240 which reduces the light intensity of light passing through the center area 220 may be further inserted on the illumination stop 22 in an optical path passing through the center area 220, as shown in FIG. 18. Since the light intensity of light having passed through the polarizers 231 and 232 and the polarizers 233 and 234 decreases, the light intensity of vertical light having passed through the center area 220 becomes higher than the first and second obliquely incident light components having passed through the first to fourth eccentric areas 221 to 224. For this reason, no desired exposure amount margin may be obtained. To prevent this, the neutral-density filter 240 is arranged near the center area 220 to control the light intensity of vertical light passing through the center area 220. The intensity of vertical light having passed through the center area 220 can become almost equal to those of the first and second obliquely incident light components having passed through the first to fourth eccentric areas 221 to 224, attaining a desired exposure amount margin.

Figure 19:
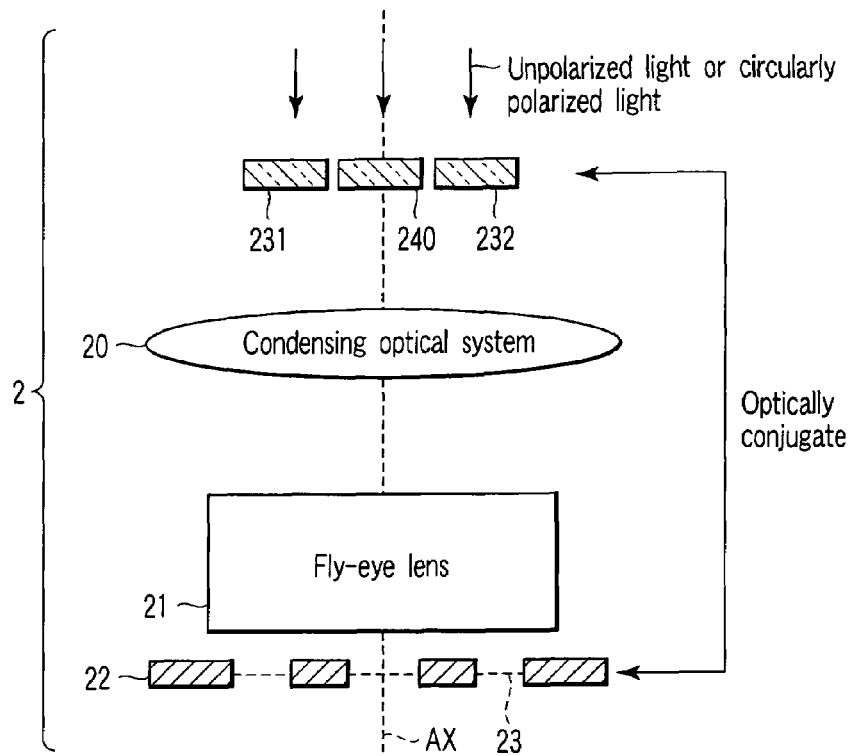
FIG. 19 is a schematic view showing an example of arranging a polarizer and neutral-density filter at optically conjugate positions when the light source emits unpolarized light or circularly polarized light according to the embodiment of the present invention.
Figure 20:
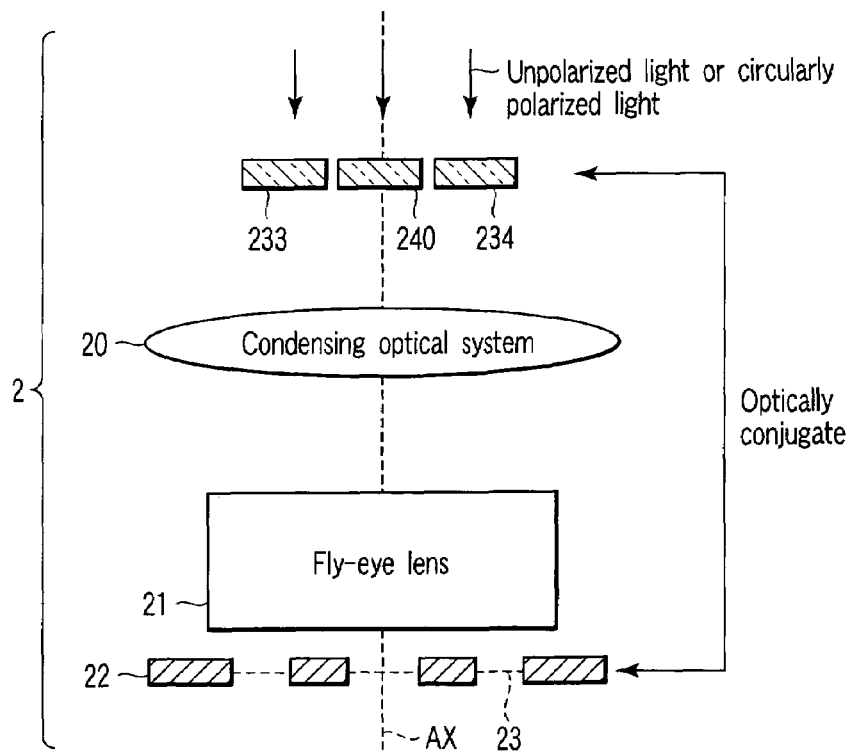
FIG. 20 is a view shown by turning the arrangement shown in FIG. 19 by 90° about AX.

When light emitted from the light source 1 is unpolarized light or circularly polarized light, the polarizers 231 and 232, the polarizers 233 and 234, and the neutral-density filter 240 may be arranged on a plane almost optically conjugate to the effective light source plane 23 on the incident side of the illumination stop 22 while being spaced apart from the illumination stop 22, as shown in FIGS. 19 and 20. Note that FIG. 20 is the view shown by turning the arrangement shown in FIG. 19 by 90° about AX.

An exposure method according to the embodiment of the present invention will be explained with reference to FIGS. 1, 6, and 7.

(1) The photomask 3 and the object 6 to be processed are respectively set on the mask stage 4 and wafer stage 7, as shown in FIG. 1.

(2) In the exposure apparatus shown in FIG. 1, the light source 1 emits, e.g., linearly polarized light. The illumination optical system 2 forms pentapole illumination through the aperture stop 52. The ½ wave plates 261 and 262 in optical paths passing through the first and second eccentric areas 221 and 222 on the illumination stop 22, and the ½ wave plates 263 and 264 shown in FIG. 11 in optical paths passing through the third and fourth eccentric areas 223 and 224 form radially polarized light as shown in FIG. 6 from linearly polarized light having passed through the condensing optical system 20 and fly-eye lens 21. The center area 220 forms circularly polarized vertical light whose electric vector vibrations are not biased in a specific direction. The first and second obliquely incident light components (radially polarized light) formed by the first to fourth eccentric areas 221 to 224 and the vertical light (circularly polarized light) formed by the center area 220 illuminate the mask pattern 30 of the photomask 3.

(3) The projection optical system 5 shown in FIG. 1 projects, onto a resist film on the object 6, the image of the mask pattern 30 of the photomask 3 obtained as a result of illumination by the first and second obliquely incident light components (radially polarized light) and vertical light (circularly polarized light). At this time, the first and second obliquely incident light components formed by the first to fourth eccentric areas 221 to 224 change into p-polarized light as shown in FIG. 7, which is projected on the resist film on the object 6. The projected resist film is developed to form a resist pattern of a hole pattern shape.

The embodiment of the present invention can increase the lithography margin by using radially polarized illumination shown in FIG. 6, and can form a fine resist pattern with a desired shape.

A semiconductor device manufacturing method according to the embodiment of the present invention will be explained with reference to the flowchart of FIG. 21. The following semiconductor device manufacturing method is merely an example, and the present invention can be implemented by other manufacturing methods including a modification of this manufacturing method.

(1) In step S100, a process simulation, lithography simulation, device simulation, and circuit simulation are performed to generate layout data (design data).

(2) In step S200, mask data of a mask pattern is generated on the basis of the design pattern of the layout data generated in step S100. A mask pattern 30 as shown in FIGS. 2 and 3 is formed on a transparent substrate 33 to form a photomask 3. In addition to the photomask 3, the photomasks of layers corresponding to respective stages of the LSI manufacturing process are formed, preparing a set of photomasks.

(3) In a front-end process (substrate process) in step S302, for example, an oxidization process in step S310, a resist application process in step S311, a photolithography process in step S312, a selective ion implantation process in step S313 using a mask formed in step S312, an annealing process in step S314, and the like are executed repetitively in a predetermined order including a combination with the chemical vapor deposition (CVD) process and etching process. FIG. 21 illustrates part of the front-end process. Since the sequence in FIG. 21 is merely an example, the sequence may omit the annealing process in step S314 and advance directly to the resist application process in step S311. The sequence also includes a combination with an ion implantation process after the etching process. After a series of processes end, the sequence advances to step S303.

(4) In step S303, a back-end process (surface wiring process) to perform a wiring process on the substrate surface is executed. In the back-end process, an interlayer dielectric film CVD process in step S315, a process in step S316 to apply a resist onto the interlayer dielectric film, a photolithography process in step S317, a process in step S318 to selectively etch the interlayer dielectric film to form a contact hole or via hole using a mask formed in step S317, a process in step S319 to deposit a metal in a via hole or damascene trench formed in step S318, and the like are executed repetitively.

Figure 21:
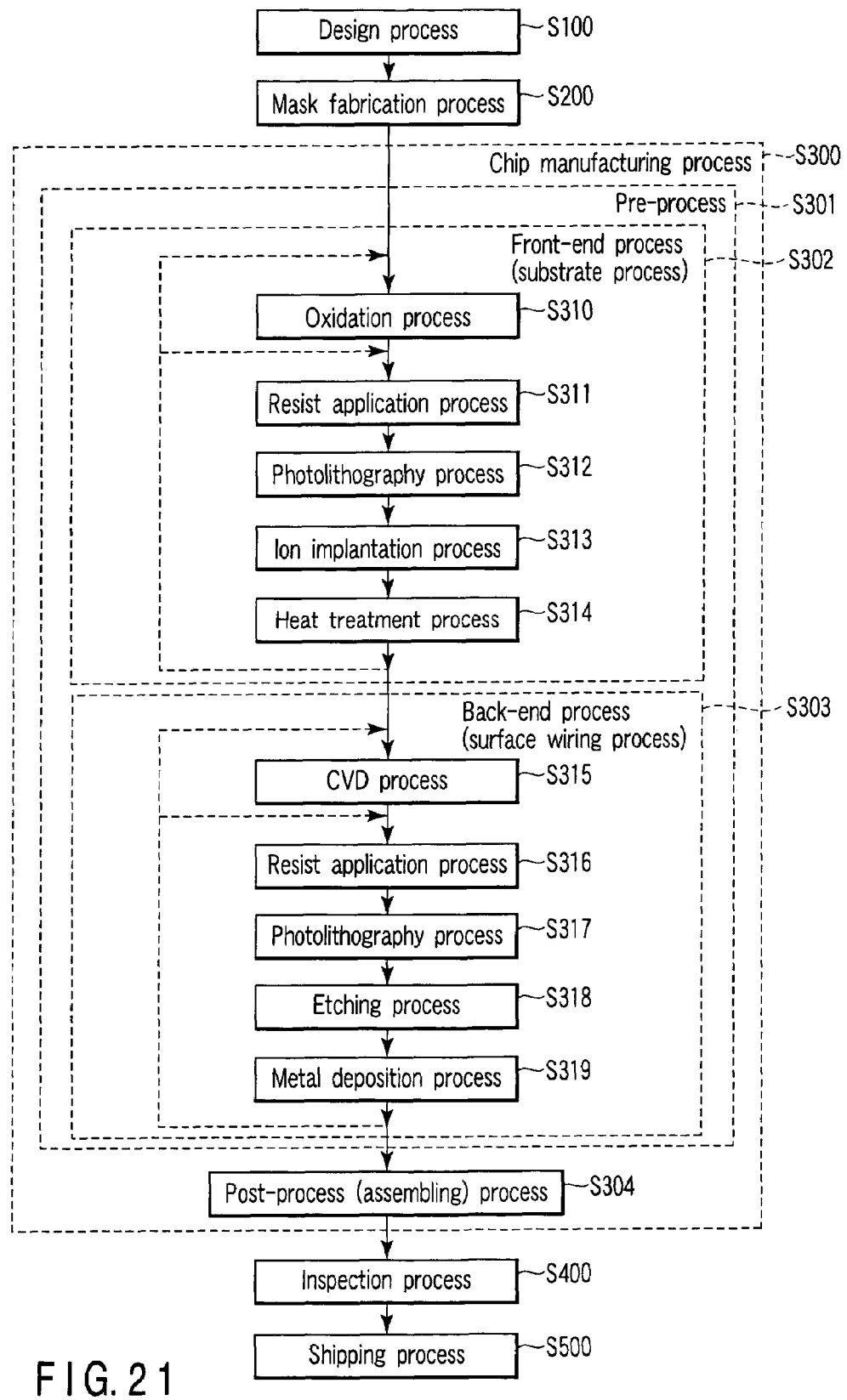
FIG. 21 is a flowchart for explaining an example of a semiconductor device manufacturing method according to the embodiment of the present invention.

Although not shown in FIG. 21, the metal film is patterned by another lithography process and a subsequent etching process after the metal deposition process in step S319. In a damascene process, a damascene trench is formed by a lithography process and subsequent etching process after the etching process in step S318, and the metal deposition process in step S319 is executed. A CMP process patterns the metal film. When forming a hole pattern in step S317, the exposure apparatus shown in FIG. 1 is used to transfer the mask pattern 30 of the photomask 3 shown in FIGS. 2 and 3 formed in step S200 onto a resist film on an object to be processed. The resist film is developed to form a resist pattern on the resist film. In step S318, the object is selectively etched using the resist pattern as a resist pattern mask, forming a hole pattern. After the multilayered interconnection structure is complete by a series of processes, the sequence advances to step S304.

(5) After the pre-process shown in step S301 is complete, the object is divided at a predetermined chip size in step S304. Each chip is mounted on a packaging material, and a packaging process is executed to, e.g., connect an electrode pad on the chip and the lead of a lead frame. A semiconductor device is complete through inspection of it in step S400, and is shipped in step S500.

As described above, according to the semiconductor device manufacturing method in the first embodiment of the present invention, the lithography margin of a fine pattern such as a hole pattern can increase by forming radially polarized illumination as shown in FIG. 6. A pattern can be formed into a desired dimension to increase the semiconductor device manufacturing yield.

Although a hole pattern is formed in step S317, a process requiring a fine dimension other than opening of a contact hole may employ the exposure apparatus of the embodiment. In the photolithography process in step S312, a process requiring a fine dimension such as formation of an etching mask for etching the gate electrode of a MOSFET may adopt the exposure apparatus of the embodiment.

First Modification

Figure 22:
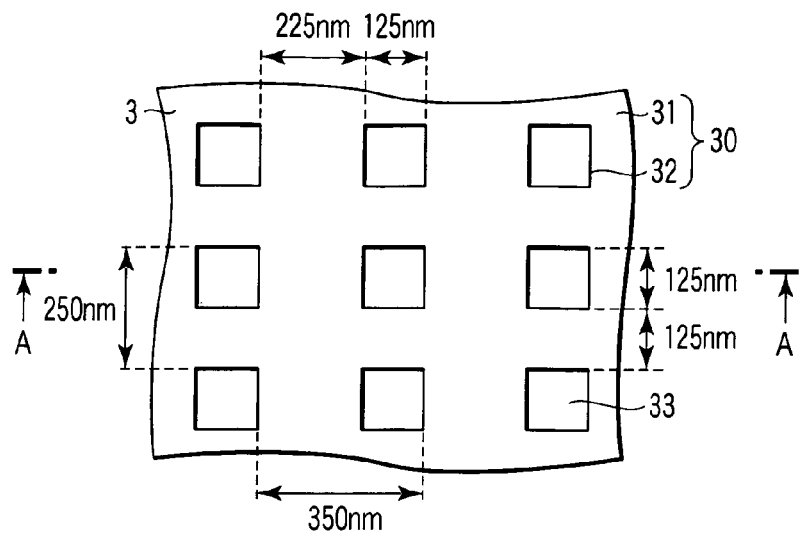
FIG. 22 is a cross-section view showing an example of a mask pattern according to the first modification to the embodiment of the present invention.
Figure 23:
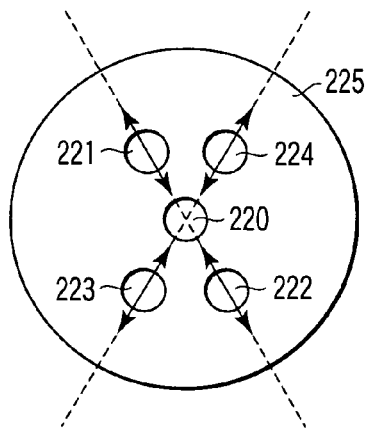
FIG. 23 is a plan view showing an example of pentapole/radially polarized illumination representing the light intensity distribution and polarization state on the effective light source plane of the illumination system of the exposure apparatus according to the first modification to the embodiment of the present invention.

The first modification to the embodiment of the present invention will explain another illumination shape. The first modification will describe a case of forming a hole pattern at different lengthwise and breadthwise pitches. As shown in FIG. 22, the space widths between adjacent apertures 32 of the mask pattern 30 are 125 nm lengthwise and 225 nm breadthwise. The mask pattern 30 shown in FIG. 22 preferably adopts pentapole illumination as shown in FIG. 23. In the pentapole illumination shown in FIG. 23, the positions of the first to fourth eccentric areas 221 to 224 shift from the axis by 45°. That is, a straight line coupling the first eccentric areas 221 and the second eccentric areas 222 crosses a straight line coupling the third eccentric areas 223 and the fourth eccentric areas 224 so that the angle between the two straight lines are not 90°. The first and second obliquely incident light components from the first to fourth eccentric areas 221 to 224 are polarized such that the electric vector vibration direction coincides with the radial direction of the effective light source plane 23. This polarization forms radial illumination.

The first modification to the embodiment of the present invention can maximize the lithography margin by shifting the positions of the first to fourth eccentric areas 221 to 224 from the axis by 45° even when the lengthwise and breadthwise pitches of the mask pattern 30 are different.

Second Modification

Figure 24:
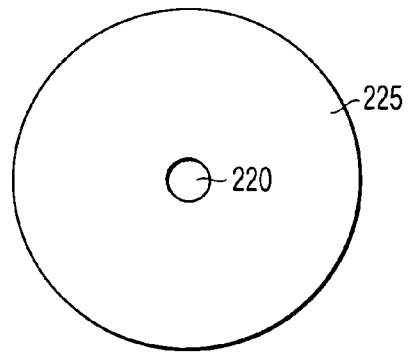
FIG. 24 is a schematic plan view showing an example of small-σ/unpolarized illumination according to the second modification to the embodiment of the present invention.
Figure 25:
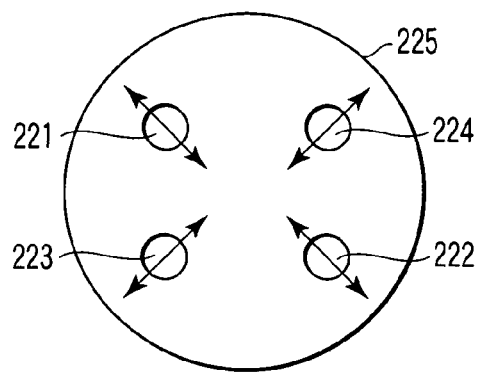
FIG. 25 is a sectional view showing an example of quadrupole/radial illumination according to the second modification to the embodiment of the present invention.

In the embodiment of the present invention, the radial polarization area, non-polarization area, or circular polarization area is formed on the effective light source plane 23, as shown in FIG. 6. In the second modification to the embodiment of the present invention, small-σ/unpolarized illumination as shown in FIG. 24 and quadrupole/radially polarized illumination as shown in FIG. 25 may be separately formed. More specifically, the small-σ/unpolarized illumination shown in FIG. 24 forms the center area 220. The quadrupole/radially polarized illumination shown in FIG. 25 form the first to fourth eccentric areas 221 to 224.

Figure 26:
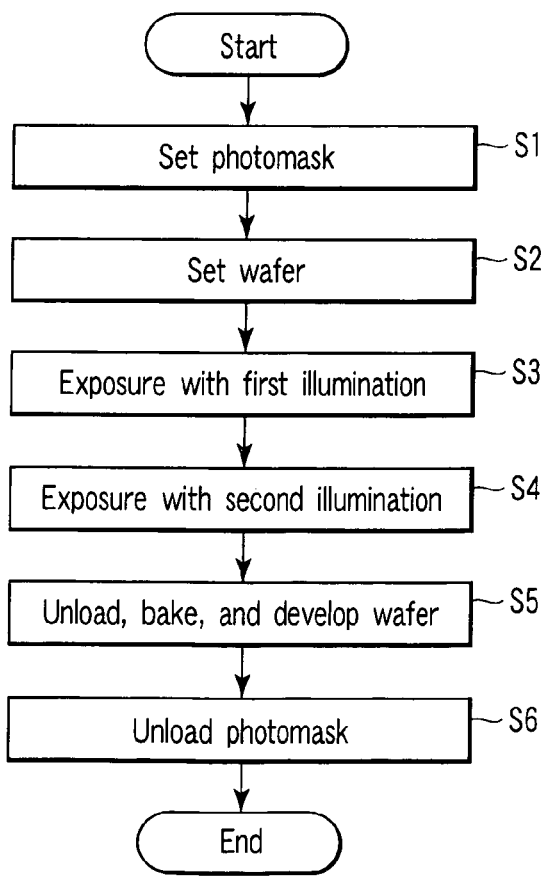
FIG. 26 is a flowchart for explaining an example of an exposure method according to the second modification to the embodiment of the present invention.

An exposure method according to the second modification to the embodiment of the present invention will be explained with reference to the flowchart of FIG. 26.

(1) In step S1, a photomask 3 is set on the mask stage 4, as shown in FIG. 1. In step S2, an object 6 to be processed is set on the wafer stage 7.

(2) In step S3, small-σ/unpolarized illumination shown in FIG. 24 is formed. The center area 220 forms unpolarized or circularly polarized vertical light whose electric vector vibrations are not biased in a specific direction. As the first illumination, vertical light illuminates the mask pattern 30 of the photomask 3. The projection optical system 5 projects the mask pattern 30 of the photomask 3 onto a resist film on the object 6.

(3) In step S4, quadrupole/radially polarized illumination shown in FIG. 25 is formed. As the second illumination, first obliquely incident light components formed by the first and second eccentric areas 221 and 222 and second obliquely incident light components formed by the third and fourth eccentric areas 223 and 224 illuminate the mask pattern 30 of the photomask 3. As shown in FIG. 7, the first and second obliquely incident light components through the projection optical system 5 change into p-polarized light components, as shown in FIG. 7, projecting the image of the mask pattern 30 onto the resist film on the object 6.

(4) In step S5, the object 6 is unloaded to bake it and develop the resist film. In step S6, the photomask 3 is unloaded.

The second modification to the embodiment of the present invention can obtain the same lithography margin as that by the embodiment of the present invention even when performing multiple (double) exposure using a plurality of (two) illuminations, like exposure by the small-σ/unpolarized illumination shown in FIG. 24 and exposure by the quadrupole/radially polarized illumination shown in FIG. 25.

Double exposure lowers the throughput from that in the embodiment of the present invention. However, the second modification does not require the coexistence of the ½ wave plates 261 and 262 or the like and the ¼ wave plate 250 as shown in FIG. 1, and can simplify the structure of the illumination optical system.

Note that the same effects can be obtained even when changing the order of exposure by the small-σ/unpolarized illumination shown in FIG. 24 in step S3 and exposure by the quadrupole/radially polarized illumination shown in FIG. 25 in step S4. Double exposure is achieved by exposing the mask pattern 30 of the photomask 3 by either the small-σ/unpolarized illumination shown in FIG. 24 or the quadrupole/radially polarized illumination shown in FIG. 25, and then switching exposure to the other one.

Other Embodiments

The above embodiment has described the present invention, but it should not be understood that a description and drawing which form part of the disclosure limit the invention. Various alternative forms, embodiments, and operational techniques will readily occur to those skilled in the art.

In the above description of the embodiment, the center area 220 and the first to fourth eccentric areas 221 to 224 have the same luminance, and the luminance distribution is uniform within each illumination. However, the center area 220 and the first to fourth eccentric areas 221 to 224 may have different luminances, and the luminance distribution may not be uniform within the center area 220 and the first to fourth eccentric areas 221 to 224. In some cases, the lithography margin further increases by adjusting the illumination shape or luminance distribution.

The first and second obliquely incident light components formed by the first to fourth eccentric areas 221 to 224 shown in FIG. 6 may not be completely polarized and contain some s-polarized components without generating only p-polarization. Polarization of illumination light can increase the lithography margin if the radially polarized component is larger than the tangentially polarized component (e.g., partial polarization or elliptic polarization), in comparison with a case where the tangentially polarized component is larger than the radially polarized component. The polarization directions in the first to fourth eccentric areas 221 to 224 may be the same within the respective illuminations. In this case, polarization is not strictly radial near the periphery in the angular direction of the first to fourth eccentric areas 221 to 224 in the respective illuminations, but produces approximately the same effect as that of radial polarization.

The center area 220 and the first to fourth eccentric areas 221 to 224 are represented by circles of the same size, but may be different in size. The shapes of the first to fourth eccentric areas 221 to 224 are not particularly limited. For example, the first to fourth eccentric areas 221 to 224 may be elliptic as shown in FIG. 27, or polygonal. The shapes of the central and peripheral illuminations may be different. For example, the center area 220 may be an annular illumination, as shown in FIG. 28. A light-shielding area 225*x* lower in light intensity than the center area 220 and the first and second eccentric areas 221 and 222 is defined inside the center area 220. Further, the center area 220 shown in FIG. 2 may employ an illumination shown in FIG. 29 prepared by dividing the peripheral available area 225 into the X- and Y-axis directions along the optical axis AX. In FIG. 29, four center areas 220*a* to 220*d* are defined. In other words, the "center area" need not be on the optical axis AX, and may be near the optical axis AX.

The embodiments can provide an exposure apparatus and method capable of increasing the lithography margin and forming a fine resist pattern into a desired shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure apparatus comprising:
an illumination optical system which forms an effective light source having a first polarization area where a mask pattern is illuminated with polarized light dominated by an electric vector component radial from a center position on an effective light source plane, and a second polarization area where the mask pattern is illuminated with unpolarized light or circularly-polarized light; and a projection optical system which projects an image of the mask pattern onto an object to be processed.

2. The apparatus according to claim 1, wherein
the first polarization area has
a first eccentric area and a second eccentric area where first obliquely incident light components for illuminating the mask pattern from opposite positions are formed, and
a third eccentric area and a fourth eccentric area where second obliquely incident light components for illuminating the mask pattern from opposite positions different from the positions of the first eccentric area and the second eccentric area are formed,
the first obliquely incident light components have electric vector components larger in a direction parallel to a straight line coupling the first eccentric area and the second eccentric area than in a perpendicular direction, and
the second obliquely incident light components have electric vector components larger in a direction parallel to a straight line coupling the third eccentric area and the fourth eccentric area than in a perpendicular direction.

3. The apparatus according to claim 1, wherein
the second polarization area is positioned at a center of the effective light source plane, and transmits either of unpolarized light and circularly polarized light as light whose electric vector vibration is not biased in the specific direction.

4. The apparatus according to claim 2, wherein
the illumination optical system includes an illumination stop arranged on an effective light source plane,
a first ½ wave plate and a second ½ wave plate are arranged on the illumination stop in optical paths passing through the first and second eccentric areas, and a third ½ wave plate and a fourth ½ wave plate are arranged on the illumination stop in optical paths passing through the third and fourth eccentric areas.

5. The apparatus according to claim 3, wherein
the illumination optical system includes an illumination stop arranged on the effective light source plane, and a ¼ wave plate is arranged on the illumination stop in an optical path passing through the second polarization area.

6. The apparatus according to claim 2, wherein
when light emitted to the illumination optical system is linearly polarized light, on a plane optically conjugate to the effective light source plane, a ¼ wave plate is arranged in an optical path passing through the second polarization area, ½ wave plates are arranged in optical paths passing through the first and second eccentric areas, and ½ wave plates are arranged in optical paths passing through the third and fourth eccentric areas.

7. The apparatus according to claim 2, wherein
the illumination optical system includes an illumination stop arranged on the effective light source plane,
when light emitted to the illumination optical system is unpolarized light or circularly polarized light, polarizers are arranged on the illumination stop in optical paths passing through the first and second eccentric areas, and polarizers are arranged on the illumination stop in optical paths passing through the third and fourth eccentric areas.

8. The apparatus according to claim 7, wherein
a filter which reduces the light intensity of light passing through the second polarization area is arranged on the illumination stop in an optical path passing through the second polarization area.

9. The apparatus according to claim 2, wherein
when light emitted to the illumination optical system is unpolarized light or circularly polarized light, on a plane optically conjugate to the effective light source plane, polarizers are arranged in optical paths passing through the first and second eccentric areas, and polarizers are arranged in optical paths passing through the third and fourth eccentric areas.

10. The apparatus according to claim 9, wherein
a filter which reduces the light intensity of light passing through the second polarization area is arranged on a plane optically conjugate to the effective light source plane in an optical path passing through the second polarization area.

11. The apparatus according to claim 2, wherein
a first straight line crosses a second straight line at an angle which is not 90°, the first straight line coupling the first eccentric area and the second eccentric area, and the second straight line coupling the third eccentric area and the fourth eccentric area.

12. The apparatus according to claim 2, wherein
the first eccentric area, the second eccentric area, the third eccentric area, and the fourth eccentric area are circular or elliptic.

13. The apparatus according to claim 3, wherein the second polarization area is annular.

14. The apparatus according to claim 3, wherein the second polarization area is divided into plural areas.

15. An exposure method comprising:
performing first illumination for a mask pattern with polarized light dominated by an electric vector component radial from a center position on an effective light source plane;
performing second illumination for the mask pattern with unpolarized light or circularly-polarized light on the effective light source plane; and
projecting an image of the mask pattern obtained as a result of the first illumination and the second illumination onto an object to be processed via a projection optical system,
wherein the first illumination and the second illumination are performed using an illumination optical system which forms an effective light source having a first polarization area where the polarized light is formed, and a second polarization area where the unpolarized light or circularly-polarized light is formed.

16. The method according to claim 15, wherein the first illumination and the second illumination are simultaneously performed.

17. A semiconductor device manufacturing method comprising:
performing first illumination for a mask pattern with polarized light dominated by an electric vector component radial from a center position on an effective light source plane;
performing second illumination for the mask pattern with unpolarized light or circularly-polarized light on the effective light source plane; and
projecting an image of the mask pattern obtained as a result of the first illumination and the second illumination onto an object to be processed via a projection optical system, thereby manufacturing a semiconductor device using the object, wherein the first illumination and the second illumination are performed using an illumination optical system which forms an effective light source having a first polarization area where the polarized light is formed, and a second polarization area where the unpolarized light or circularly-polarized light is formed.

18. The method according to claim 17, wherein the first illumination and the second illumination are simultaneously performed.

19. The method according to claim 15, wherein the second illumination is performed after the first illumination.

20. The method according to claim 17, wherein the second illumination is performed after the first illumination.

* * * * *